United States Patent [19]
Swamy et al.

[11] Patent Number: 5,835,357
[45] Date of Patent: Nov. 10, 1998

[54] CERAMIC INTEGRATED CIRCUIT PACKAGE WITH OPTIONAL IC REMOVABLY MOUNTED THERETO

[75] Inventors: Deepak Swamy; Thomas J. Kocis, both of Austin, Tex.

[73] Assignee: Dell USA, L.P., Round Rock, Tex.

[21] Appl. No.: 523,426

[22] Filed: Sep. 5, 1995

[51] Int. Cl.$^6$ .............. H05K 7/02; H05K 7/10; H01L 23/52

[52] U.S. Cl. ............. 361/764; 361/783; 257/697; 257/777; 439/69; 174/52.1; 174/260; 174/264

[58] Field of Search .............. 361/733, 735, 361/744, 761, 762, 764, 783, 785, 790, 791, 803; 257/678, 685, 686, 697, 777, 778; 439/68, 69, 70, 525; 324/755, 765; 174/260, 261, 262, 266, 52.1–52.4

[56] References Cited

U.S. PATENT DOCUMENTS

| | | | |
|---|---|---|---|
| 5,066,831 | 11/1991 | Spielberger et al. | 174/52.4 |
| 5,384,692 | 1/1995 | Jaff | 361/785 |
| 5,412,537 | 5/1995 | Magill et al. | 439/68 |
| 5,612,657 | 3/1997 | Kledzik | 361/735 |

*Primary Examiner*—Leo P. Picard
*Assistant Examiner*—John B. Vigushin
*Attorney, Agent, or Firm*—Skjerven, Morrill, MacPherson, Franklin & Friel; Stephen A. Terrile

[57] ABSTRACT

A ceramic package for an integrated circuit (IC) and a method of manufacturing the ceramic package. The package comprises: (1) a ceramic body having opposing substantially planar first and second surfaces thereon, a cavity in the body and a plurality of vias passing through the body and intercepting the first and second surfaces, (2) an integral IC located within the cavity, (3) a plurality of electrical conductors located on the surfaces, passing through the plurality of vias and coupled to the IC, the plurality of conductors adapted to allow communication of electrical signals through the body and with the IC and (4) first and second electrical connectors located on the first and second surfaces, respectively, the first electrical connector allowing an optional IC to be removably mounted to the package and coupled to the plurality of electrical conductors, the second electrical connector allowing the package to be mounted to a supporting circuit board, the package thereby allowing the integral and optional ICs to communicate the electrical signals therebetween and with the circuit board.

10 Claims, 2 Drawing Sheets

CERAMIC INTEGRATED CIRCUIT PACKAGE WITH OPTIONAL IC REMOVABLY MOUNTED THERETO

TECHNICAL FIELD OF THE INVENTION

The present invention is directed, in general, to packages for integrated circuits ("ICs)" and, more specifically, to a ceramic package structure that allows ICs to be stacked over one another, thereby increasing circuit density and reducing speed-limiting transmission line effects in conductors coupling the ICs together.

BACKGROUND OF THE INVENTION

Today's personal computers ("PCs") are many times more powerful than the relatively primitive PCs of the 1970s and 80s. Current technology has produced a PC that essentially has the computing power of a minicomputer; it is only a matter of time before PCs attain the full power of mainframe computers.

One of the many ways in which PCs have become more powerful is with respect to the speed and sophistication of their microprocessor-based central processing units ("CPUs"). One advance in PC architecture particularly germane to the present discussion is that of multiprocessor PCs, in which special multiprocessing software or hardware divides a task to be executed among two or more individual processors. Depending upon the degree to which the task may be divided, multiprocessor PCs may realize quantum gains in processing speed over single processor PCs.

Despite such apparent advantages in computing power, two-processor PCs have only begun to enter the marketplace. This is so, in part, because problems unique to multiprocessor architecture must first be solved to make such PCs more reliable and economical. One of the many problems facing designers of such PCs concerns the mechanical mounting and electrical interconnection of the two microprocessors comprising the CPU.

With respect to mechanical mounting, individual microprocessors have grown to such a size (almost 2 inches square for the Intel Pentium®) that two such processors and their associated sockets and support componentry occupy a significant area of the PC's motherboard.

With respect to electrical interconnection, the Pentium® processor, for example, has more than three hundred electrical pins. Almost all of these pins require a connection to a separate trace on the motherboard, allowing address, data and control signals to be communicated to and from the processor. The physical routing of these traces is a vexing problem, particularly given their required density proximate the processor. Due in part to the number of traces required, it is not practical to mount the processors contiguously. Thus, the processors of today's multiprocessor PCs are spaced apart by at least a few inches, forcing the motherboard, and possibly the chassis therefor, to be correspondingly larger and more expensive. Because the two processors often require many of the same signals, the traces must traverse the motherboard from one processor to the other.

Additionally, the number of traces required results in larger motherboards containing narrow traces arrange in many trace layers, significantly increasing the complexity, cost and manufacturing rejection rate of such motherboards.

Furthermore, the traces of the motherboard are electrical conductors, required to carry high frequency electrical signals, in the form of binary ones and zeroes (bits), between the two processors and other PC components. During operation, each particular trace may change between binary one and binary zero many millions of times a second. Individual bits in the signals thus should have relatively sharp rising and falling edges and be relatively brief in duration.

It is vital to preserve the integrity and fidelity of the data transmitted over the traces. Therefore, it is important that transitions between binary one and binary zero be fast and sure. In an ideal world, the traces change voltages instantaneously and data are transmitted reliably.

Unfortunately, in the real world, traces are real electrical conductors and therefore exhibit capacitance, resistance and inductance (so-called "transmission line effects"). Capacitance traps electrical charge within the trace, presenting, in a sense, a momentum against which the change must take place. Resistance dissipates electrical energy in the trace, reducing the efficiency of the trace, possibly resulting in lost data and a compromise in data integrity. Inductance causes crosstalk between neighboring conductors (mutual inductance) or resistance to changes in voltage on a given conductor (self inductance), possibly further corrupting data. Finally, capacitance, resistance and inductance can cooperate to cause harmonic sympathy on conductors in a trace, resulting in spurious frequencies being created, maintained or amplified.

During design of a new computer system, it is important to ensure that traces are not susceptible to signal distortion from stray capacitance, resistance or inductance. According to accepted design rules, traces should be (among other things) as short as possible. The long distance routing of the traces of today's motherboards (caused by the spaced-apart processor mounting) results not only in a complex motherboard, but also runs afoul of this design rule and likely introduces unnecessary limitations in the speed of today's multiprocessor PCs.

Today's microprocessors are individually packaged within ceramic shells to allow their densely-packed conductors (separated by only 7 microns or so) to be expanded to a lower density (separated by at least 5 mils) pin or ball grid array ("PGA" or "BGA") suitable for connection to today's conventionally-fabricated motherboards. While such ceramic packages are conventional and reliable, the traditional configuration of one microprocessor per package has resulted in the disadvantageous spaced-apart mounting of multiple microprocessors as detailed above. What is needed in the art is an advance in packaging technology for microprocessors that dispenses with the need for such single microprocessor packaging and resulting spaced-apart mounting.

SUMMARY OF THE INVENTION

To address the above-discussed deficiencies of the prior art, it is a primary object of the present invention to provide a ceramic package that allows ICs to be stacked over one another, thereby avoiding the trace routing and resulting electromagnetic problems detailed above.

In the attainment of the above primary object, the present invention provides a ceramic package for an IC and a method of manufacturing the ceramic package. The package comprises: (1) a ceramic body having opposing substantially planar first and second surfaces thereon, a cavity in the body and a plurality of vias passing through the body and intercepting the first and second surfaces, (2) an integral IC located within the cavity, (3) a plurality of electrical conductors located on the surfaces, passing through the plurality of vias and coupled to the IC, the plurality of conductors adapted to allow communication of electrical signals through the body and with the IC and (4) first and second electrical connectors located on the first and second surfaces, respectively, the first electrical connector allowing an optional IC to be removably mounted to the package and coupled to the plurality of electrical conductors, the second electrical connector allowing the package to be mounted to a supporting circuit board, the package thereby allowing the integral and optional ICs to communicate the electrical signals therebetween and with the circuit board.

The present invention therefore fundamentally adapts a ceramic package to receive an electrical connector on both its first and second surfaces, allowing the ceramic package to be mounted between the circuit board and the optional IC and permitting a stacking of the ICs.

In a preferred embodiment of the present invention, the first electrical connector comprises a zero insertion force ("ZIF") socket. Such sockets are conventional and allow for easy insertion and removal of the optional IC. The present invention therefore is useful in a computer architecture wherein an optional processor may or may not be added to supplement a main processor. In such arrangements, the optional processor is sometimes called an "overdrive".

The main processor is preferably integral with the ceramic package, allowing the optional processor to be piggybacked thereon via the ZIF socket. Of course, those of ordinary skill in the art will perceive that connectors other than ZIF sockets (such as low insertion force, or "LIF" sockets) are within the broad scope of the present invention.

In a preferred embodiment of the present invention, the second electrical connector comprises a plurality of pins extending from the second surface of the body. Thus, the present invention preferably contemplates a PGA configuration to allow the package to be mounted to the circuit board. Alternatively, other configurations, such as a dual inline package ("DIP"), quad flat pack ("QFP") or BGA, are within the scope of the invention.

In a preferred embodiment of the present invention, the plurality of electrical conductors are located in intermediate layers within the body, the intermediate layers being substantially parallel with the first and second surfaces. Therefore, the present invention preferably provides for redistribution layers within the ceramic package to accommodate applications in which it is not possible to confine trace routing to the first and second surfaces.

In a preferred embodiment of the present invention, the plurality of electrical conductors comprise a plurality of offset pads located on the first and second surfaces, the offset pads allowing the first and second electrical connectors to be located on the first and second surfaces, respectively. Those of ordinary skill in the art are familiar with offset pads and their advantageous use with vias.

In a preferred embodiment of the present invention, the integral IC is a microprocessor. As stated above, the present invention finds particular utility with microprocessors, allowing multiprocessor PCs to avoid the above-detailed trace routing problems. However, the present invention is by no means limited to microprocessors, inasmuch as many applications employing multiple ICs may use the present invention to advantage.

In a preferred embodiment of the present invention, the ceramic package further comprises a plurality of wire bonds coupling the integral IC to the plurality of electrical conductors. Wire bonding, however, is but one of the ways in which the integral IC may be electrically connected to the plurality of electrical conductors. C4 and C5 are but two of the conventional processes that may be employed to so couple the IC.

In a preferred embodiment of the present invention, the second electrical connector comprises a PGA or BGA. Those of ordinary skill in the art are familiar with the structure and advantages of such connectors.

In a preferred embodiment of the present invention, the ceramic package further comprises a sealing layer deposited over the integral IC to seal the integral IC within the cavity. The sealing layer encapsulates the integral IC within the package, protecting the IC from injury from contact with the elements. Of course, the sealing layer is only optional.

In a preferred embodiment of the present invention, the integral and optional ICs are microprocessors cooperable to form a multiprocessor for a PC. Again, those of ordinary skill in the art will readily find other advantageous applications for the present invention.

As mentioned above, the present invention further provides a method of manufacturing a ceramic package for an IC, comprising the steps of: (1) forming a ceramic body having opposing substantially planar first and second surfaces thereon, a cavity in the body and a plurality of vias passing through the body and intercepting the first and second surfaces, (2) locating a plurality of electrical conductors on the surfaces and through the plurality of vias, the plurality of conductors adapted to allow communication of electrical signals through the body, (3) locating an integral IC within the cavity, the integral IC coupled to the plurality of electrical conductors, the plurality of conductors further adapted to allow communication of the electrical signals with the IC and (4) locating first and second electrical connectors on the first and second surfaces, respectively, the first electrical connector allowing an optional IC to be removably mounted to the package and coupled to the plurality of electrical conductors, the second electrical connector allowing the package to be mounted to a supporting circuit board, the package thereby allowing the integral and optional ICs to communicate the electrical signals therebetween and with the circuit board.

The step of forming preferably comprises the steps of molding an alumina slurry into a desired shape and punching the plurality of vias into the body. The step of locating the plurality of electrical conductors preferably comprises the steps of filling the plurality of vias with a copper paste, screen printing traces on the body, laminating ceramic layers and layers of ones of the plurality of electrical conductors together to form the body and electroplating selected ones of the plurality of electrical conductors with nickel.

The method preferably further comprises the step of co-firing the body and the plurality of electrical conductors prior to the step of locating the integral IC. The step of locating the first and second electrical connectors preferably comprises the step of brazing the first and second electrical connectors to the plurality of electrical conductors and electroplating portions of the first and second electrical connectors with nickel. Finally, the method further comprises the step of grinding the body to prescribed dimensions.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
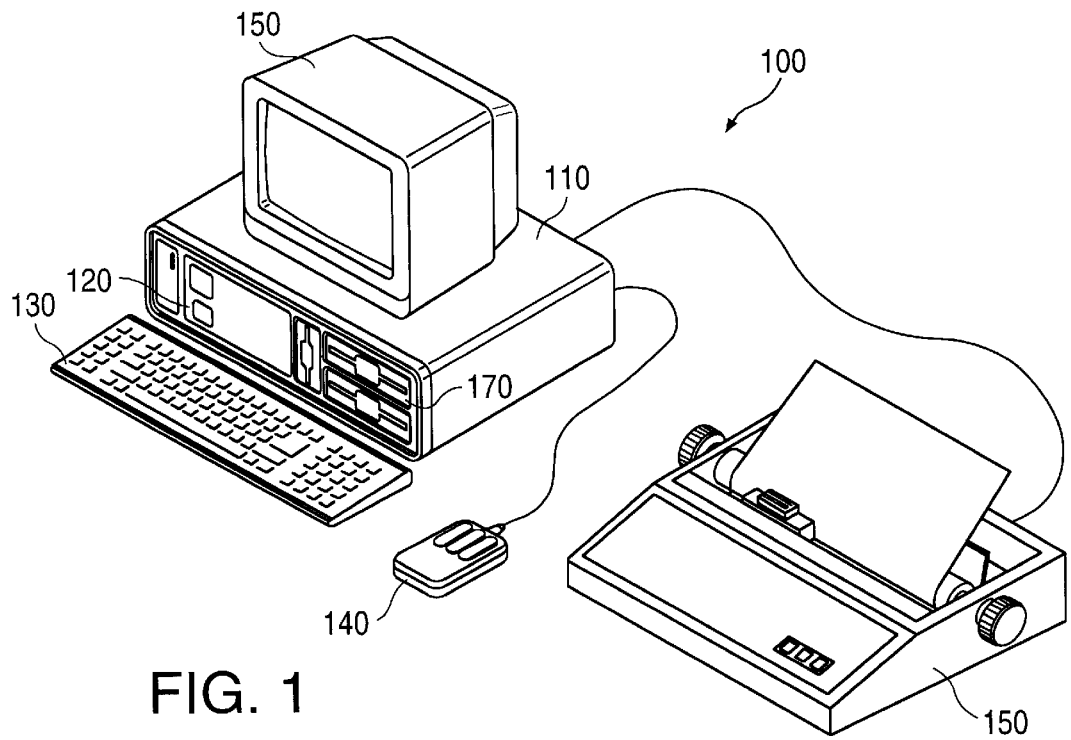
FIG. 1 illustrates an isometric view of a PC that provides an environment within which the present invention can operate.

Referring initially to FIG. 1, illustrated is a PC 100 that provides an environment within which the present invention operates. The PC 100 comprises a main chassis 110 containing computer system components to be illustrated and discussed in more detail with regard to FIG. 2. The main chassis 110 features, among other things, a reset button 120, a momentary switch used to signal a CPU and other components (e.g. memory and input/output ("I/O") controllers not shown in FIG. 1) within the PC 100 to reboot, thereby providing a means of rebooting the PC 100. Coupled through individual connectors on the main chassis 110 are a keyboard 130, a mouse 140 and a video monitor 150. The peripheral devices 130, 140, 150, 160 allow the PC 100 to interact with a user. FIG. 1 also shows a disk drive 170, allowing permanent storage of computer system data on magnetic media.

Figure 2:
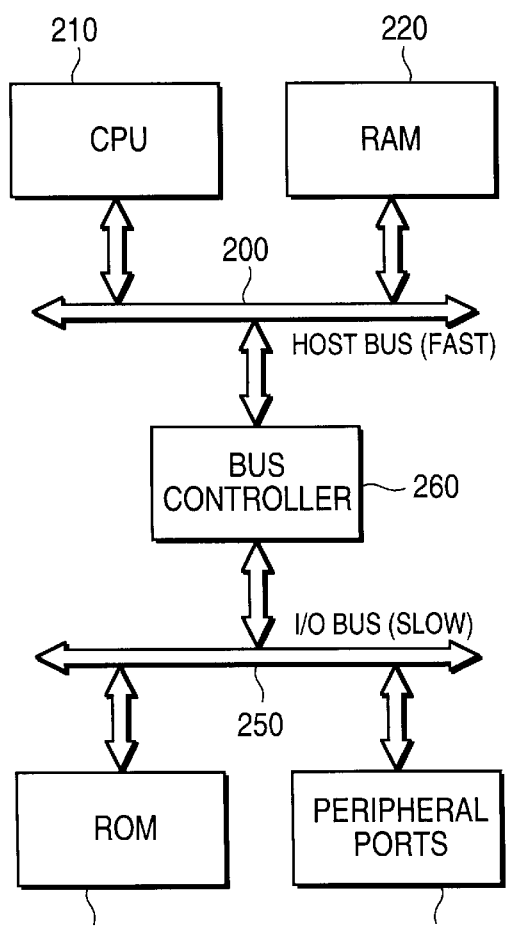
FIG. 2 illustrates a block diagram of components of the PC of FIG. 1 that provide an environment within which the present invention can operate.

Turning now to FIG. 2, illustrated is a block diagram of an architecture of the PC of FIG. 1 that serves as an environment within which the present invention can operate. Specifically, the architecture is embodied in electronic components that reside within the main chassis 110 of FIG. 1.

Shown is a host bus 200. Coupled to the host bus 200 are a CPU 210 and random access memory ("RAM") 220. Of course, the CPU 210 may comprise more than one microprocessor acting in concert.

An I/O bus 250 is coupled to read-only memory ("ROM") 230 and peripheral ports 240. The peripheral ports 240 couple the I/O bus 250 to the peripheral devices 130, 140, 150, 160, 170 of FIG. 1 for communication therewith. Included among the peripheral ports 240 is a parallel port. Finally, a bus controller 260 couples the host bus 200 and the I/O bus 250 to provide a path for and manage communication therebetween. The host bus 200 is relatively fast to facilitate rapid communication between the CPU 210 and the RAM 220 and is burdened with as few components as possible to maximize its speed. The I/O bus 250 is allowed to run at a slower pace because its speed is less critical. Each of the lines of the buses 200, 250 require a drive current to carry signals thereon. Accordingly, the present invention operates in conjunction with a system controller that supplies the required drive current. Of course, the present invention can also function within an architecture that only has a single bus.

Figure 3:
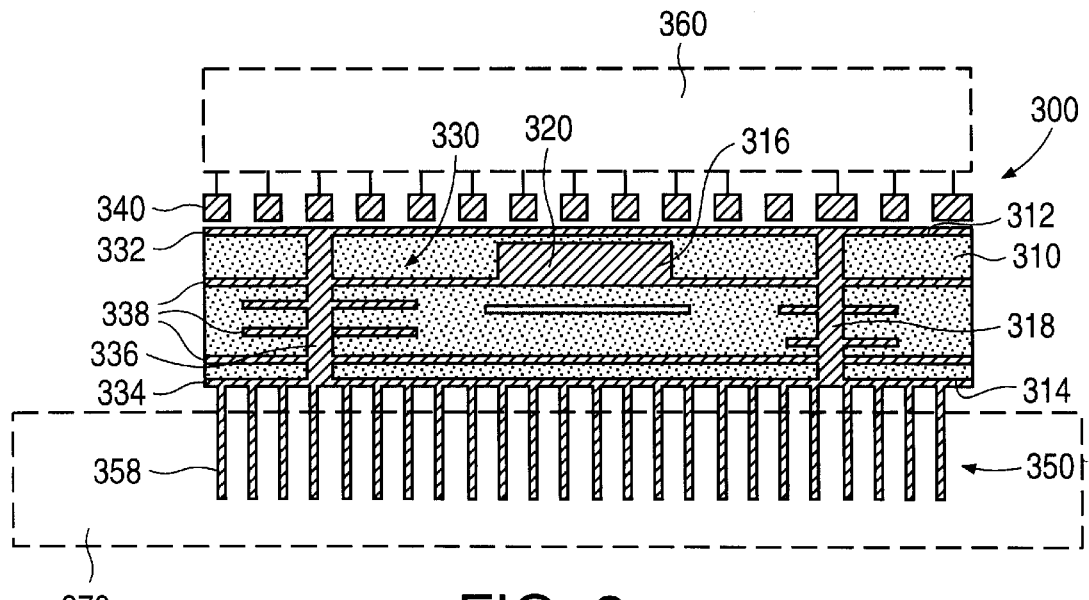
FIG. 3 illustrates an elevational view of a ceramic package embodying the present invention.

Turning now to FIG. 3, illustrated is an elevational view of a ceramic package, generally designated 300, embodying the present invention. The package 300 comprises a ceramic body 310 having opposing substantially planar first and second surfaces 312, 314 thereon. A cavity 316 is located in the body 310 and is sized to receive an integral IC 320. A plurality of vias 318 pass through the body 310 and intercept the first and second surfaces 312, 314, creating passageways therebetween.

A plurality of electrical conductors 330 is located on the first and second surfaces 312, 314 in the form of layers of top surface metal ("TSM") 332 and bottom surface metal ("BSM") 334. The plurality of electrical conductors 330 also take the form of metal fillings 336 passing through the plurality of vias 318. The plurality of electrical conductors 330 are coupled to the IC 320 as required, thereby adapting the plurality of electrical conductors 330 to allow communication of electrical signals through the ceramic body 310 and with the IC 320.

The plurality of electrical conductors 330 may further take the form of one or more intermediate layers 338 disposed within the body 310 and substantially parallel with the first and second surfaces 312, 314. These intermediate, or redistribution, layers 338 accommodate applications in which it is not possible to confine trace routing to the TSM 332 and BSM 334 (particularly in applications requiring large numbers of traces and vias, such as with stacked microprocessors).

Figure 6:
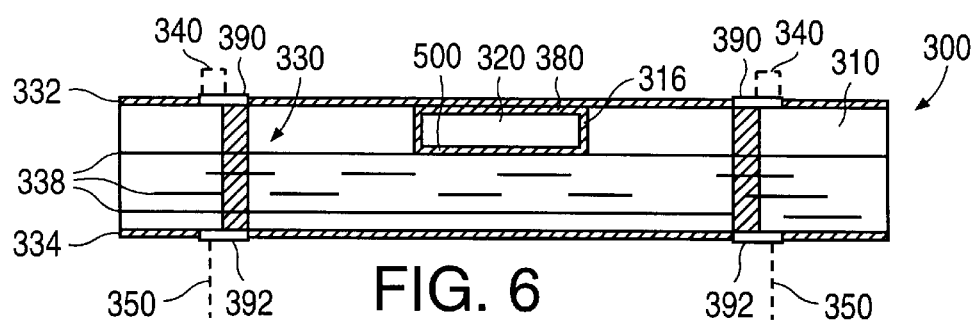
FIG. 6 illustrates an elevational view of the ceramic package of FIG. 3 after the step of locating an integral IC and prior to the step of locating the first and second electrical connectors.

In the illustrated embodiment, the plurality of electrical conductors 330 comprise a plurality of offset pads 390 and 392 located on the first and second surfaces 312, 314, respectively (See FIG. 6). The offset pads allow first and second electrical connectors 340, 350 to be located on the first and second surfaces 312, 314, respectively, and offset from the plurality of vias 318.

The first and second electrical connectors 340, 350 are located on the first and second surfaces 312, 314, respectively. The first electrical connector allows an optional IC (shown in phantom line and designated 360) to be removably mounted to the package 300 and coupled to the plurality of electrical conductors 330. The second electrical connector allows the package 300 to be mounted as a whole to a supporting circuit board (shown in phantom line and designated 370). When the optional IC 370 and package 300 are so mounted, the package 300 allows the integral and optional ICs 320, 360 to communicate the electrical signals therebetween and with the circuit board 370 and thereby permits a stacking of the ICs 320, 360.

In the illustrated embodiment, the first electrical connector 340 comprises a ZIF socket. Such sockets are conventional and allow for easy insertion and removal of the optional IC 360. As previously described, however, connectors other than ZIF sockets (such as LIF sockets or solder pads for permanently soldering the optional IC 360 in place) are within the broad scope of the present invention.

In the illustrated embodiment, the second electrical connector 350 comprises a plurality of pins 352 extending from the second surface 314 of the body 310. The illustrated embodiment therefore employs a PGA configuration to allow the package 300 to be mounted to the circuit board 370. As described above, other configurations, such as a dual inline package ("DIP"), quad flat pack ("QFP") or BGA, are within the scope of the invention.

The ceramic package preferably further comprises a sealing layer 380 deposited over the integral IC 320 to seal the integral IC 320 within the cavity 316. The sealing layer 380 encapsulates the integral IC 320 within the package 300, protecting the integral IC 320 from injury from contact with the elements, such as tools, dust and dirt.

As mentioned above, the present invention further provides a method of manufacturing a ceramic package for an IC. The method comprises the steps of: (1) forming the ceramic body 310, (2) locating the plurality of electrical conductors 330 on the surfaces 312, 314 of the ceramic body 310, (3) locating the integral IC 320 within the cavity 316 of the body 310 and (4) locating the first and second electrical connectors 340, 350 on the surfaces of the body 310.

Figure 4:
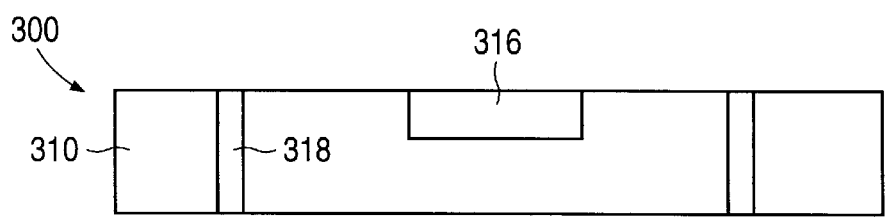
FIG. 4 illustrates an elevational view of the ceramic package of FIG. 3 after the step of forming and prior to the step of locating the plurality of electrical conductors.

Turning now to FIG. 4, illustrated is an elevational view of the ceramic package 300 of FIG. 3 after the step of forming and prior to the step of locating the plurality of electrical conductors 330. The step of forming preferably comprises the steps of molding an alumina slurry into a desired shape and punching the plurality of vias 318 into the body 310. At this point, the molded slurry is commonly referred to as "greenware." If the resulting package 300 is to have intermediate or redistribution layers 338, the body may be formed into layers of greenware material and interdigitated with conductive layers to form the intermediate layers 338. Apart from providing the cavity 316 in the body 310, the method to this point is conventional.

Figure 5:
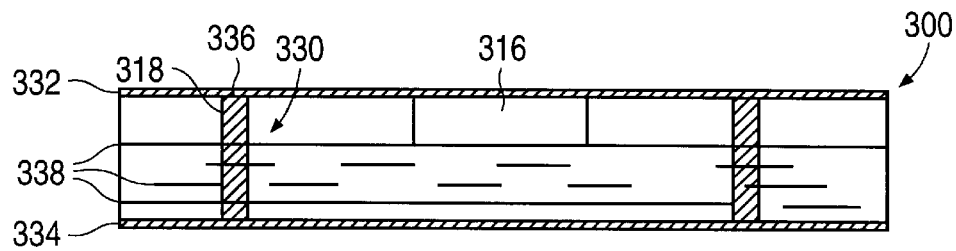
FIG. 5 illustrates an elevational view of the ceramic package of FIG. 3 after the step of locating the plurality of electrical conductors and prior to the step of locating an integral IC.

Turning now to FIG. 5, illustrated is an elevational view of the ceramic package 300 of FIG. 3 after the step of locating the plurality of electrical conductors 330 and prior to the step of locating the integral IC 330. The step of locating the plurality of electrical conductors 330 preferably comprises the steps of filling the plurality of vias 318 with a copper paste, screen printing traces on the body 310, laminating the greenware layers and layers of ones of the plurality of electrical conductors together to form the body 310 (in the case of intermediate layers being required) and electroplating selected ones of the plurality of electrical conductors with nickel. Next, the assembled greenware package 300 is co-fired to yield a ceramic package 300.

Once the ceramic package 300 has cooled, the integral IC 320 is deposited into the cavity 316 and electrically connected to the plurality of electrical conductors 330. The electrical connection may be made by conventional wire bonding, C4 or C5 processes or other processes as desired. The illustrated embodiment, however, employs wire bonding. Therefore, the ceramic package further comprises a plurality of wire bonds 500 coupling the integral IC 320 to the plurality of electrical conductors 330.

Turning now to FIG. 6, illustrated is an elevational view of the ceramic package of FIG. 3 after the step of locating the integral IC 320 and prior to the step of locating the first and second electrical connectors 340, 350. FIG. 6 shows offset pads 390 and 392 with electrical connectors 340 and 350 shown in phantom. The step of locating the first and second electrical connectors 340, 350 preferably comprises the step of brazing the first and second electrical connectors 340, 350 to the plurality of electrical conductors 330 and electroplating portions of the first and second electrical connectors 340, 350 with nickel. Next, the integral IC 320 is preferably sealed in place by depositing the sealing layer 380. Finally, the body is ground to prescribed dimensions to complete the package 300.

Following completion of the package 300, the package may be tested for proper electrical operation. The testing can be performed with the optional IC 360 in place within the first electrical connector 340 or absent therefrom.

From the above description, it is apparent that the present invention provides a ceramic package for an IC and a method of manufacturing the ceramic package. The package comprises: (1) a ceramic body having opposing substantially planar first and second surfaces thereon, a cavity in the body and a plurality of vias passing through the body and intercepting the first and second surfaces, (2) an integral IC located within the cavity, (3) a plurality of electrical conductors located on the surfaces, passing through the plurality of vias and coupled to the IC, the plurality of conductors adapted to allow communication of electrical signals through the ceramic body and with the IC and (4) first and second electrical connectors located on the first and second surfaces, respectively, the first electrical connector allowing an optional IC to be removably mounted to the package and coupled to the plurality of electrical conductors, the second electrical connector allowing the package to be mounted to a supporting circuit board, the package thereby allowing the integral and optional ICs to communicate the electrical signals therebetween and with the circuit board.

Although the present invention and its advantages have been described in detail, those skilled in the art should understand that they can make various changes, substitutions and alterations herein without departing from the spirit and scope of the invention in its broadest form.

What is claimed is:

1. A ceramic package for an integrated circuit (IC), comprising:

a ceramic body having opposing substantially planar first and second surfaces thereon, a cavity in said body and a plurality of vias passing through said body and intercepting said first and second surfaces;

an integral IC located within said cavity;

a plurality of electrical conductors located on said surfaces, passing through said plurality of vias and coupled to said IC, said plurality of conductors adapted to allow communication of electrical signals through said body and with said IC; and first and second electrical connectors located on said first and second surfaces, respectively, said first electrical connector allowing an optional IC to be removably mounted to said package at least partially above said integral IC and coupled to said plurality of electrical conductors, said second electrical connector allowing said package to be mounted to a supporting circuit board, said package thereby allowing said integral and optional ICs to communicate said electrical signals therebetween and with said circuit board.

2. The ceramic package as recited in claim 1 wherein said first electrical connector comprises a zero insertion force (ZIF) socket.

3. The ceramic package as recited in claim 1 wherein said second electrical connector comprises a plurality of pins extending from said second surface of said body.

4. The ceramic package as recited in claim 1 wherein said plurality of electrical conductors are located in intermediate layers within said body, said intermediate layers being substantially parallel with said first and second surfaces.

5. The ceramic package as recited in claim 1 wherein said plurality of electrical conductors comprise a plurality of offset pads located on said first and second surfaces, said offset pads allowing said first and second electrical connectors to be located on said first and second surfaces, respectively.

6. The ceramic package as recited in claim 1 wherein said integral IC is a microprocessor.

7. The ceramic package as recited in claim 1 further comprising a plurality of wire bonds coupling said integral IC to said plurality of electrical conductors.

8. The ceramic package as recited in claim 1 wherein said second electrical connector comprises a pin grid array (PGA) or ball grid array (BGA).

9. The ceramic package as recited in claim 1 further comprising a sealing layer deposited over said integral IC to seal said integral IC within said cavity.

10. The ceramic package as recited in claim 1 wherein said integral and optional ICs are microprocessors cooperable to form a multiprocessor for a personal computer (PC).

* * * * *